United States Patent
Muraoka et al.

(10) Patent No.: US 7,422,953 B2
(45) Date of Patent: Sep. 9, 2008

(54) SEMICONDUCTOR DEVICE AND METHOD OF MANUFACTURING THE SAME

(75) Inventors: Kouichi Muraoka, Sagamihara (JP); Kazuaki Kurihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 429 days.

(21) Appl. No.: 10/846,644

(22) Filed: May 17, 2004

(65) Prior Publication Data

US 2004/0214400 A1    Oct. 28, 2004

Related U.S. Application Data

(62) Division of application No. 10/241,456, filed on Sep. 12, 2002, now Pat. No. 6,800,519.

(30) Foreign Application Priority Data

Sep. 27, 2001  (JP)  ............................. 2001-295367
Mar. 29, 2002  (JP)  ............................. 2002-094149

(51) Int. Cl.
*H01L 27/088* (2006.01)
(52) U.S. Cl. .................. 438/386; 257/289; 257/411; 257/412; 257/E27.06; 257/E29.15; 257/E29.242
(58) Field of Classification Search .......... 257/288, 257/607, 405–414, 327, 368, 617, 295, 310, 257/E27.104, E29.164, E29.272, E21.208, 257/E21.436, E21.663, 289, 609, 900, E27.06, 257/E29.139, E29.15, E29.242
See application file for complete search history.

(56) References Cited

U.S. PATENT DOCUMENTS

| | | | | |
|---|---|---|---|---|
| 3,852,120 | A * | 12/1974 | Johnson et al. | 438/474 |
| 4,317,686 | A * | 3/1982 | Anand et al. | 438/162 |
| 4,837,172 | A * | 6/1989 | Mizuno et al. | 438/475 |
| 5,998,838 | A * | 12/1999 | Tanabe et al. | 257/347 |
| 6,013,553 | A * | 1/2000 | Wallace et al. | 438/287 |
| 6,120,597 | A * | 9/2000 | Levy et al. | 117/3 |
| 6,208,030 | B1 * | 3/2001 | Tsui et al. | 257/758 |
| 6,465,335 | B1 * | 10/2002 | Kunikiyo | 438/592 |
| 6,486,080 | B2 * | 11/2002 | Chooi et al. | 438/785 |

(Continued)

FOREIGN PATENT DOCUMENTS

JP    3-46226    2/1991

(Continued)

OTHER PUBLICATIONS

J. P. Maria et al., High Temperature Stability in Lanthanum and Zirconia-based Gate Dielectrics, *Journal of Applied Physics*, vol. 90, No. 7, Oct. 1, 2001, pp. 3476-3482.

(Continued)

*Primary Examiner*—Fernando L. Toledo
*Assistant Examiner*—Quovaunda Jefferson
(74) *Attorney, Agent, or Firm*—Oblon, Spivak, McClelland, Maier & Neustadt, P.C.

(57) ABSTRACT

There is provided a method of manufacturing a semiconductor device, including forming a structure including a first layer containing Si and a metal oxide layer in contact with the first layer, the metal oxide layer having a dielectric constant higher than that of silicon oxide, and heating the structure in an atmosphere containing He and/or Ne.

2 Claims, 6 Drawing Sheets

U.S. PATENT DOCUMENTS

| | | | |
|---|---|---|---|
| 6,552,403 B1 | 4/2003 | Lucovsky | |
| 6,613,658 B2 * | 9/2003 | Koyama et al. | 438/591 |
| 6,635,517 B2 * | 10/2003 | Chen et al. | 438/143 |
| 6,693,324 B2 * | 2/2004 | Maegawa et al. | 257/347 |
| 6,713,819 B1 * | 3/2004 | En et al. | 257/369 |
| 2005/0054182 A1 * | 3/2005 | Wang | 438/528 |

FOREIGN PATENT DOCUMENTS

| | | |
|---|---|---|
| JP | 10-209403 | 8/1998 |
| JP | 11-168212 | 6/1999 |
| JP | 2000-269483 | 9/2000 |
| JP | 2001-189312 | 7/2001 |
| JP | 2001-313292 | 11/2001 |
| JP | 2002-50624 | 2/2002 |

OTHER PUBLICATIONS

Heiji Watanabe, Interface Engineering of a $ZrO_2/SiO_2/Si$ Layered Structure by in situ Reoxidation and its Oxygen-pressure-dependent Thermal Stability, *Applied Physics Letters*, vol. 78, No. 24, Jun. 11, 2001, pp. 3803-3805.

T. S. Jeon et al., Thermal Stability of Ultrathin $ZrO_2$ Films Prepared by Chemical Vapor Deposition on Si(100), *Applied Physics Letters*, vol. 78, No. 3, Jan. 15, 2001, pp. 368-370.

V. V. Afanas'ev et al., Pressure Dependence of $Si/SiO_2$ Degradation Supresion by Helium, *Journal of Applied Physics*, vol. 87, No. 10, pp. 7338-7341.

* cited by examiner

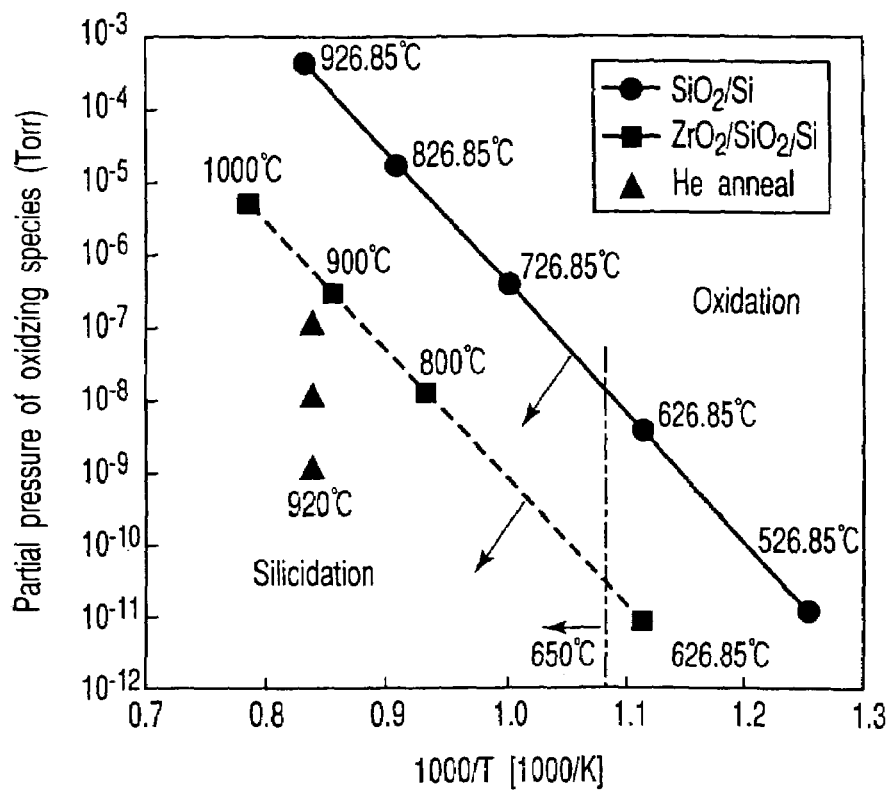
FIG. 3
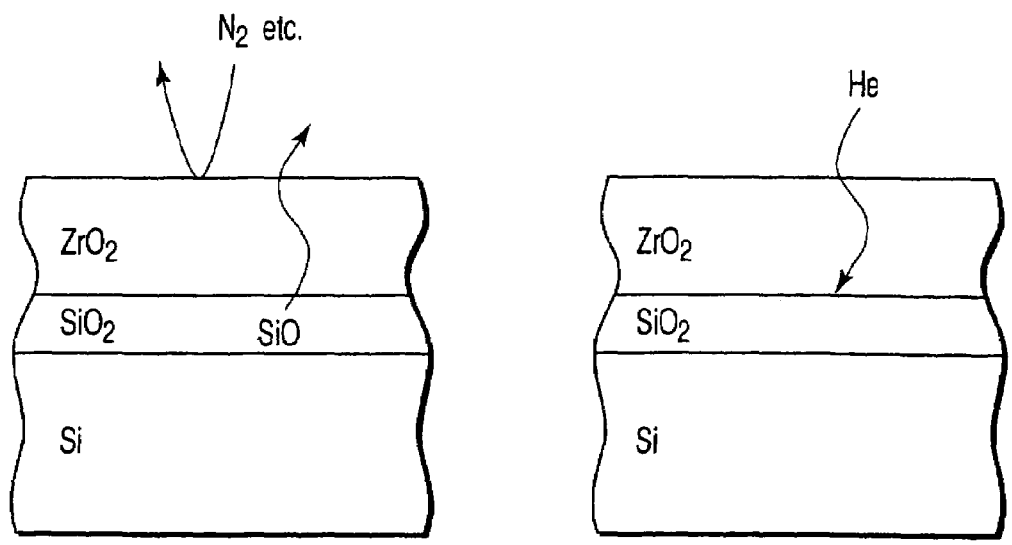
FIG. 4A
PRIOR ART
FIG. 4B

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 2001-295367, filed Sep. 27, 2001; and No. 2002-94149, filed Mar. 29, 2002, the entire contents of both of which are incorporated herein by reference.

BACKGROUND OF THE INVENTION

1. Field of the Invention

The present invention relates to a semiconductor device and a method of manufacturing the same.

2. Description of the Related Art

In accordance with miniaturization of the silicon semiconductor integrated circuit, the size of an MIS (Metal Insulator Semiconductor) transistor is rendered smaller and smaller. According to ITRS (International Technology Road map for Semiconductors), 2000 edition, the technology nodes of 60 nm require EOT (Equivalent Oxide Thickness), which is a thickness of the gate insulator converted into the thickness of a silicon oxide film based on the dielectric constant, falling within a range of between 0.8 nm and 1.2 nm. However, if EOT is set to fall within the range noted above and a silicon oxide film or a silicon oxynitride film is used as a gate insulator, it is impossible to suppress sufficiently the leak current. Therefore, it is necessary to use an insulating film with a high dielectric constant, i.e., a high-k film containing metal, as the gate insulator.

In recent years, vigorous research has been conducted on, for example, $Ta_2O_5$, $TiO_2$, $Al_2O_3$, $ZrO_2$, $HfO_2$, Zr silicate ($ZrSiO_x$) and Hf silicate ($HfSiO_x$) as a material of the next generation gate insulator with a high dielectric constant. Particularly, $ZrO_2$, $HfO_2$ and silicates thereof are high in the thermodynamic stability on an Si substrate, have a high dielectric constant and a large band gap and, thus, are considered to be particularly hopeful as a material of the gate insulator of the sub-1 nm generation.

However, the following problems are pointed out in respect of the thermal stability in the interface between the ternary insulator such as M—Si—O (M=Zr, Hf) and the Si substrate.

The first problem is derived from the situation that oxidizing species such as $O_2$ and $H_2O$ have a relatively high diffusion rate within the particular insulator. If the oxidizing species have a high diffusion rate within the insulating film, traces of the oxidizing species contained in the atmosphere are readily migrated through the insulating film during various heat treatment steps, with the result that a thick $SiO_2$ film is formed at the interface between the insulator and the Si substrate. The formation of the $SiO_2$ film lowers the dielectric constant of the gate insulator so as to increase EOT.

The second problem is brought about in the case where the partial pressure of the oxidizing species within the heat treating atmosphere is lowered in an attempt to prevent the $SiO_2$ film from being formed. Specifically, if the structure of an insulating film/Si substrate is subjected to a heat treatment at a temperature not lower than 900° C. under UHV (Ultra High Vacuum) in which the partial pressure of the oxidizing species is lowered, it has been confirmed that a metal silicide ($MSi_x$) is produced at the interface between the high-k film and the Si substrate, which brings about degradation of the morphology. Incidentally, the particular reaction takes place not only at the interface between the high-k film and the Si substrate but also at the interface between the high-k film and a polycrystalline silicon (poly-Si) gate electrode or a polycrystalline silicon germanium (poly-SiGe) gate electrode.

As described above, in order to suppress the formation of an $SiO_2$ film at the interface between the high-k film and the Si substrate, it is necessary to suppress the partial pressure of the oxidizing species to a low level in the atmosphere. However, if the partial pressure of the oxidizing species is excessively lowered, a silicide is formed. Therefore, in the case where an Si substrate having a high-k film formed thereon is subjected to a heat treatment step, it is necessary to control the partial pressure of the oxidizing species in the atmosphere to fall within a prescribed range in order to suppress both formation of an $SiO_2$ film and silicide.

However, the partial pressure range of the oxidizing species in which formation of an $SiO_2$ film and a silicide can be suppressed is very narrow, which makes it very difficult to control the partial pressure of the oxidizing species to fall within the desired range. This raises a serious obstacle in applying a high-k film to the present semiconductor process, which includes many heat treatment steps at high temperatures such as an activation anneal.

BRIEF SUMMARY OF THE INVENTION

According to a first aspect of the present invention, there is provided a method of manufacturing a semiconductor device, comprising forming a structure including a first layer containing Si and a metal oxide layer in contact with the first layer, the metal oxide layer being higher in dielectric constant than silicon oxide, and heating the structure in an atmosphere containing He and/or Ne.

According to a second aspect of the present invention, there is provided a method of manufacturing a semiconductor device, comprising forming a structure including a first layer containing Si and a metal oxide layer in contact with the first layer, the metal oxide layer being higher in dielectric constant than silicon oxide and at least one of the first layer and the metal oxide layer containing He and/or Ne, and heating the structure.

According to a third aspect of the present invention, there is provided a semiconductor device, comprising a first layer containing Si, and a metal oxide layer in contact with the first layer, the metal oxide layer being higher in dielectric constant than silicon oxide, and at least one of the first layer and the metal oxide layer containing He and/or Ne.

In each of the first and second aspects of the present invention, it is possible for the particular structure to further comprise a second layer. Also, the device according to the third aspect of the present invention may further comprise a second layer.

In each of the first to third aspects of the present invention, it is possible for the metal oxide layer to be a gate insulator. It is possible for the first layer to include at least one of an Si underlying layer, a gate electrode and a sidewall insulating film. Also, it is possible for the particular structure or the device to further comprise as the second layer at least one of, for example, an Si underlying layer, a gate electrode and a sidewall insulating film.

It is possible for the Si underlying layer to be, for example, an Si substrate or an Si substrate of an SOI substrate. It is possible for that surface of the Si underlying layer which faces the metal oxide layer to be oxidized. In other words, it is possible for the Si underlying layer to comprise a silicon oxide film formed on the surface thereof that faces the metal oxide layer.

It is possible for the first layer to be, for example, an Si layer or an SiGe layer. Alternatively, it is possible for the first layer to be an insulating layer containing Si such as a silicon oxide layer or a silicon oxynitride layer.

Similarly, it is possible for the second layer to be, for example, an Si layer or an SiGe layer. Alternatively, it is possible for the second layer to be an insulating layer containing Si such as a silicon oxide layer or a silicon oxynitride layer.

The metal oxide layer has a dielectric constant higher than that of silicon oxide. It is possible to use a metal oxide, a metal oxynitride or a silicate containing a metal, Si and oxygen as the material of the metal oxide layer satisfying the particular requirement. The material that can be used for forming the metal oxide layer includes, for example, $ZrO_2$, $HfO_2$, $BeO$, $MgO$, $SrO$, $BaO$, $Y_2O_3$, $CeO_2$, $Pr_xO_y$, $Nd_2O_3$, $ThO_2$, $RuO_2$, $IrO_2$, $Al_2O_3$, $In_2O_3$, $ZrON$, $HfON$, $ZrSiO_x$, $HfSiO_x$, $ZrSiO_xN$, and $HfSiO_xN$. It is possible for the metal oxide layer to be made of a single or a plurality of materials. Also, it is possible for the metal oxide layer to be of a single or multi-layered structure.

In the first aspect of the present invention, it is possible for the heat treatment of the structure to comprise heat treating the structure in the atmosphere at an absolute temperature T of 650° C. or higher. In this case, it is possible for the sum of the partial oxygen and water vapor pressures in the atmosphere, to be $133 \times 10^{11.703-18114/T}$ Pa or lower. Alternatively, it is possible for this pressure to be $133 \times 10^{8.903-18114/T}$ Pa or lower.

In the first and second aspects of the present invention, it is possible for the formation of the structure to comprise forming a metal oxide layer on an Si underlying layer and depositing Si or SiGe on the metal oxide layer by a chemical vapor deposition using a silane gas as at least a part of a raw material gas so as to form the first layer. In this case, it is possible for the chemical vapor deposition to comprise depositing Si or SiGe on the metal oxide layer with the temperature of the Si underlying layer set lower than 600° C., and further depositing Si or SiGe on the metal oxide layer by elevating the temperature of the Si underlying layer to 600° C. or higher.

It is possible for the method according to each of the first and second aspects of the present invention to further comprise patterning the first layer and the metal oxide layer before heating the particular structure so as to form a gate electrode and a gate insulator, respectively.

It is also possible for the method according to each of the first and second aspects of the present invention to further comprise oxidizing the surface of at least one of the first and the second layers by using an oxidizing atmosphere containing He and/or Ne before heating the particular structure.

In each of the first and second aspects of the present invention, it is possible for at least one of the first layer, the second layer and the metal oxide layer to contain He and/or Ne.

It is also possible for the method according to each of the first and second aspects of the present invention to further comprise supplying at least one of the first layer, the second layer and the metal oxide layer with He and/or Ne.

In the second aspect of the present invention, it is possible for the heating of the particular structure to be carried out in an atmosphere containing He and/or Ne.

Further, in each of the first and second aspects of the present invention, it is possible for every heat treatments that is carried out at a temperature of 650° C. or higher after forming the particular structure to be carried out in an atmosphere containing He and/or Ne.

BRIEF DESCRIPTION OF THE SEVERAL VIEWS OF THE DRAWING

FIG. 3 is a graph showing examples of the influences of the partial pressure of the oxidizing species and the heat treatment temperature on the formation of an $SiO_2$ film and a silicide;

FIG. 4A is a view schematically showing the heat treatment carried out in UHV or $N_2$ atmosphere;

FIG. 4B is a view schematically showing the heat treatment carried out in a He atmosphere;

DETAILED DESCRIPTION OF THE INVENTION

Figure 1A:
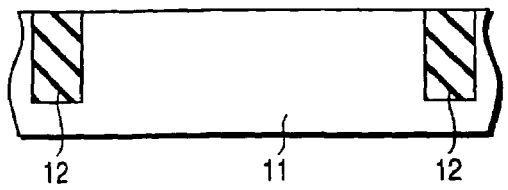
FIGS. 1A to 1F are cross sectional views schematically showing the method of manufacturing a semiconductor device according to a first embodiment of the present invention.

Some embodiments of the present invention will now be described in detail with reference to the accompanying drawings. Incidentally, the constituting elements performing the same function are denoted by the same reference numerals throughout the drawing for avoiding the overlapping description.

FIGS. 1A to 1F are cross sectional views schematically showing the method of manufacturing a semiconductor device according to a first embodiment of the present invention. The first embodiment is directed to a method of manufacturing an MIS transistor by the method described below.

First, a deep trench is formed in a surface region of a p-type silicon single crystal substrate (or wafer) 11, as shown in FIG. 1A. Then, the trench is filled with a silicon oxide film 12 by a CVD (Chemical Vapor Deposition) method. The silicon oxide film 12 filling the trench plays the role of a device isolation region.

Figure 1B:
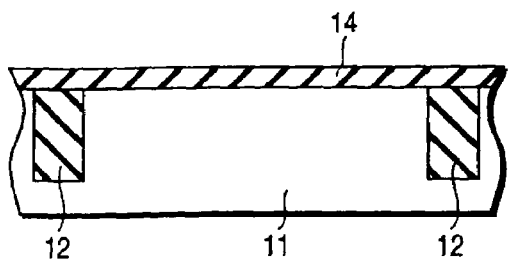

Next, a $ZrO_2$ layer 14 is formed on the substrate 11 as a high-k metal oxide layer, as shown in FIG. 1B. Incidentally, the method of forming the $ZrO_2$ layer 14 including the pretreament will be described herein later.

Figure 1C:
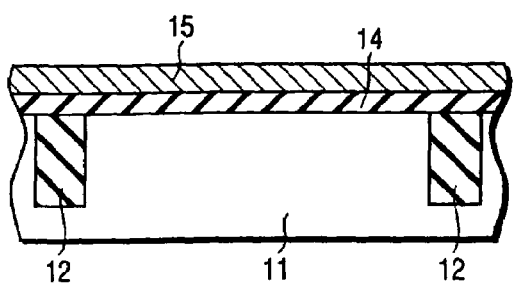
Figure 1D:
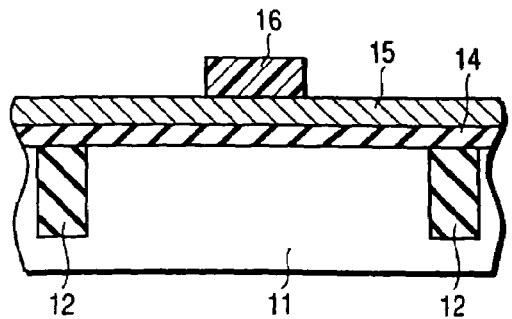

After formation of the $ZrO_2$ layer 14, a polysilicon layer 15 is formed on the $ZrO_2$ layer 14 by a CVD method, as shown in FIG. 1C, followed by forming a photoresist pattern 16 on the polysilicon layer 15, as shown in FIG. 1D.

Figure 1E:
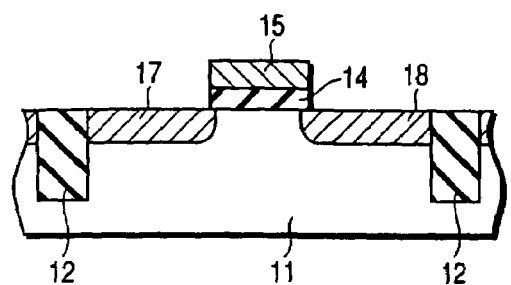

Then, the polysilicon layer 15 is patterned by RIE (Reactive Ion Etching) with the photoresist pattern 16 used as a mask, followed by patterning the $ZrO_2$ layer by RIE so as to obtain a gate electrode 14 and a gate insulator 14, as shown in FIG. 1E. After formation of the gate electrode 15 and the gate insulator 14, an ion implantation of arsenic is carried out under an acceleration energy of 40 keV and with a dose of $2 \times 10^{15}$ cm$^{-2}$, followed by performing an activation anneal so as to form simultaneously an n$^+$-type gate electrode 15, an n$^+$-type source region 17 and an n$^+$-type drain region 18 each having a high impurity concentration.

Figure 1F:
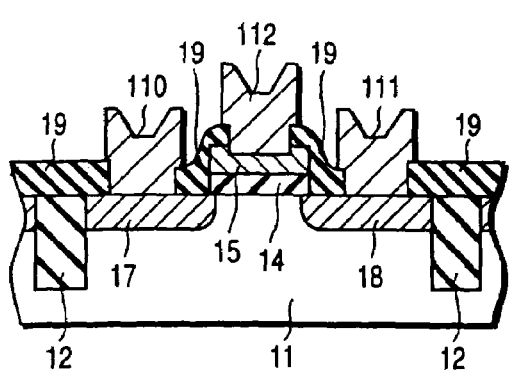

Next, a silicon oxide film 19 is deposited in a thickness of 300 nm by a CVD method on the entire surface, followed by patterning the silicon oxide film 19 so as to form a sidewall insulating film and an interlayer insulation film, as shown in FIG. 1F. Then, a photoresist pattern for forming contact holes is formed on the interlayer insulation film 19, followed by patterning the interlayer insulation film 19 by RIE with the photoresist pattern used as a mask so as to form contact holes in the interlayer insulation film 19. Finally, an Al film is formed on the entire surface by a sputtering method, followed by patterning the Al film so as to form a source electrode 110, a drain electrode 111 and a second gate electrode 112, thereby finishing the manufacture of an n-type MOS transistor. Incidentally, FIGS. 1A to 1F are directed to a process of manufacturing an n-type MOS transistor. It should be noted in this connection that a p-type MOS transistor can also be manufactured as above, except that the conductivity type is rendered opposite to that described above.

The method of forming the ZrO$_2$ layer 14 will now be described.

Specifically, the structure shown in FIG. 1A is subjected to a hydrochloric acid/ozone treatment as a pretreatment so as to remove effectively the contaminant from the surface of the silicon wafer 11. As a result, a chemical oxide film having a thickness of about 1 nm is formed on the surface of the silicon wafer 11. Incidentally, it is possible to apply a treatment with a dilute hydrofluoric acid after formation of the chemical oxide film so as to decrease the EOT.

Next, the wafer 11 after the pretreatment is transferred into a sputtering chamber. In the sputtering chamber, the ZrO$_2$ film 14 having a thickness of about 2 nm is formed on the chemical oxide film by the sputtering method using a ZrO$_2$ target and an Ar/O$_2$ gas RF plasma (400 W) while maintaining the temperature of the wafer 11 at room temperature.

Then, a heat treatment is applied in a He and/or Ne atmosphere in order to increase the density of the ZrO$_2$ layer 14 and to decrease the defect therein. The heat treatment was carried out in a He atmosphere as an example. The heat treatment conditions in this case were as follows:

| Heat Treatment Conditions (He atmosphere): | |
|---|---|
| Background vacuum level: | $133 \times 5.4 \times 10^{-10}$ Pa |
| He gas pressure: | 133 Pa |
| Sum of oxygen and water partial pressures in atmosphere: | $133 \times 10^{-9}$ Pa |
| Substrate temperature: | 920° C. |
| Heat treatment time: | 10 minutes |

For comparison, heat treatments under conditions different from that described above were applied to two additional samples, respectively. One of these two samples was annealed in an N$_2$ atmosphere and the other was annealed in UHV, as shown below:

| Heat treatment conditions (N$_2$ atmosphere): | |
|---|---|
| Background vacuum level: | $133 \times 5.4 \times 10^{-10}$ Pa |
| N$_2$ gas pressure: | 133 Pa |
| Sum of oxygen and water vapor partial pressures in atmosphere: | $133 \times 10^{-9}$ Pa |
| Substrate temperature: | 920° C. |
| Heat treatment time: | 10 minutes |
| Heat treatment conditions (UHV): | |
| Vacuum level: | $133 \times 10^{-9}$ Pa |
| Substrate temperature: | 920° C. |
| Heat treatment time: | 10 minutes |

Figure 2A:
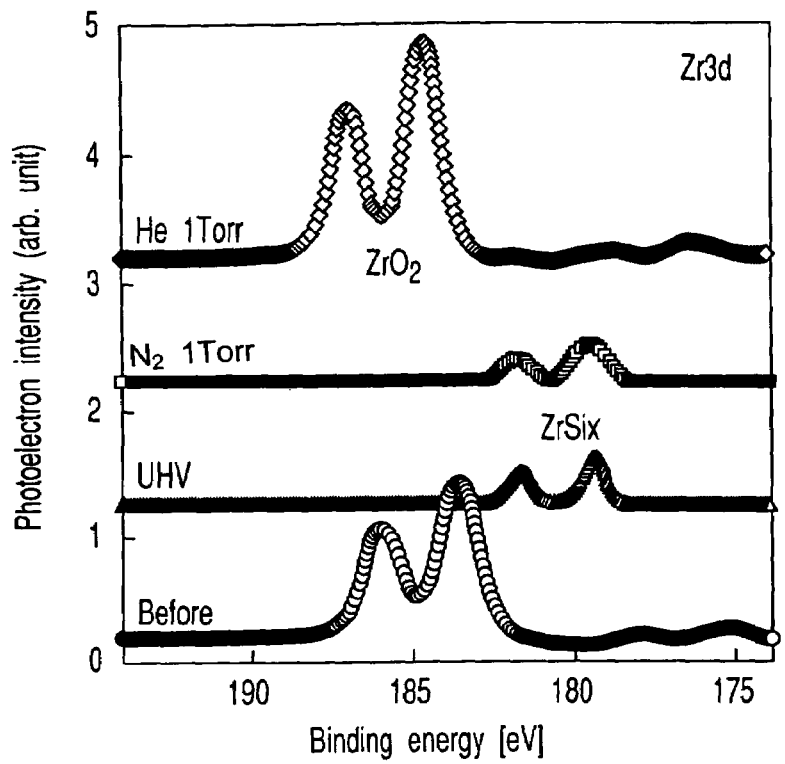
FIG. 2A is a graph showing the Zr3d spectra.
Figure 2B:
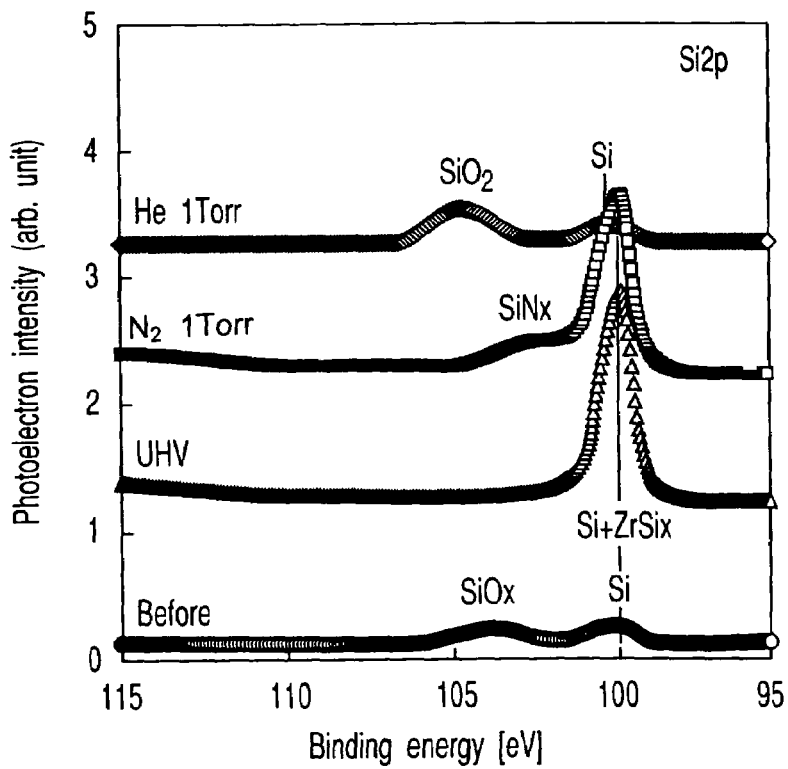
FIG. 2B is a graph showing the Si2p spectra.

The binding state in a stacked structure of the ZrO$_2$ layer 14 and the SiO$_2$ film was examined by an in-situ XPS (in-situ X-ray photoelectron spectroscopy) in respect of the samples after the heat treatments and the samples before the heat treatments. In measuring the bonding state, Mg K$_\alpha$ was used as the X-ray source, and the take-off angle of photoelectron was set at 45°. FIGS. 2A and 2B shows the result.

FIG. 2A is a graph showing the Zr3d spectra, and FIG. 2B is a graph showing the Si2p spectra. In the graph of each of FIGS. 2A and 2B, the binding energy is plotted on the horizontal axis and the photoelectron intensity is plotted on the vertical axis.

As apparent from FIGS. 2A and 2B, a peak corresponding to ZrSi$_x$ is not included in the Zr3d spectrum and the Si2p spectrum obtained in respect of the sample before the heat treatment. Also, as shown in FIG. 2B, a low peak corresponding to SiO$_x$ is included in the Si2p spectrum obtained in respect of the sample before the heat treatment.

As for the sample after the heat treatment in an N$_2$ atmosphere, as shown FIGS. 2A and 2B, a peak corresponding to ZrO$_2$ disappeared from the Zr3d spectrum and a peak corresponding to ZrSi$_x$ appeared in the Zr3d spectrum and the Si2p spectrum. Also, as for the sample after the heat treatment in N$_2$ atmosphere, as shown in FIG. 2B, a peak corresponding to SiO$_x$ disappeared from the Si2p spectrum and a peak corresponding to SiN$_x$ appeared.

As for the sample after the heat treatment in UHV, as shown in FIGS. 2A and 2B, a peak corresponding to ZrO$_2$ disappeared from the Zr3d spectrum and a peak corresponding to ZrSi$_x$ appeared in the Zr3d spectrum and the Si2p spectrum. Also, as for the sample after the heat treatment under UHV, as shown in FIG. 2B, a peak corresponding to SiO$_x$ was not included in the Si2p spectrum.

As described above, the ZrO$_2$ layer 14 disappeared in each of the case where the heat treatment was carried out in an N$_2$ atmosphere and the case where the heat treatment was carried out in UHV, and a ZrSi$_x$ layer was formed in accordance with the disappearance of the ZrO$_2$ layer 14. It is considered reasonable to understand that the particular situation is brought about because the partial pressure of the oxidizing species is excessively low in the N$_2$ atmosphere and in UHV so as to bring about reactions represented by, for example, reaction formulas (1) and (2) given below:

$$SiO_2 + Si \rightarrow 2SiO\uparrow \qquad (1)$$

$$ZrO_2 + SiO\uparrow + 2.5Si \rightarrow ZrSi_2 + 1.5SiO_2 \qquad (2)$$

Incidentally, a peak corresponding to SiN$_x$ is included in the Si2p spectrum obtained in respect of the sample after the heat treatment in an N$_2$ atmosphere. This is because that the SiO$_x$ layer is disappeared by the reaction (1) from the interface and the surface of the silicon substrate 11, from which the SiO$_x$ layer is disappeared, is nitrided. Also, the ZrSi$_x$ intensity of the sample after the heat treatment in an N$_2$ atmosphere and in UHV is lower than the ZrO$_x$ intensity of the sample before the heat treatment. The particular situation is considered to have been brought about because ZrSi$_x$ grains produced by the reaction (2) were positioned not only on the silicon substrate 11 but in the silicon substrate 11 and the amount of Zr atoms on the surface of the silicon substrate 11 was decreased. It is noted that the state that ZrSi$_x$ grains were embedded in the silicon substrate 11 from which the SiO$_x$ layer had been disappeared was observed by cross section TEM (transmission electron microscope).

As described above, it was impossible to suppress ZrSi$_x$ in each of the case where the heat treatment was carried out in an N$_2$ atmosphere and the case where the heat treatment was carried out in UHV. On the other hand, the Zr3d spectrum and the Si2p spectrum obtained in respect of the sample after the heat treatment in a He atmosphere were substantially equal to the Zr3d spectrum and the Si2p spectrum obtained in respect of the sample before the heat treatment, as apparent from FIGS. 2A and 2B. In other words, formation of an SiO$_2$ film and a silicide is sufficiently suppressed in the sample subjected to the heat treatment in a He atmosphere.

Incidentally, the peak shape corresponding to ZrO$_2$ is sharper after the heat treatment in a He atmosphere than that before the heat treatment and is slightly shifted toward a higher energy side. This is because the heat treatment in a He atmosphere increases a thermal stability of the structure of the ZrO$_2$ layer 14 and increases the insulation properties so as to promote the charge-up caused by the X-ray irradiation. Also, the peak shape corresponding to SiO$_x$ after the heat treatment in a He atmosphere is sharper than that before the heat treatment and is slightly shifted toward a higher energy side, though the thickness of the SiO$_2$ film before the heat treatment remains unchanged after the heat treatment in a He atmosphere. The particular situation is brought about because the SiO$_2$ film is thermally stabilized by the heat treatment in a He atmosphere.

As described above, in the case of utilizing a He and/or Ne atmosphere, it is possible to suppress formation of an SiO$_2$ film and a silicide even if the heat treatment is carried out at a high temperature exceeding 900° C.

Then, the influences of the oxidizing species partial pressure in a He and/or Ne atmosphere and the heat treatment temperature on the effect of suppressing the formation of an SiO$_2$ film and a silicide were studied.

FIG. 3 is a graph exemplifying the influences of the oxidizing species partial pressure and the heat treatment temperature on the formation of an SiO$_2$ film and a silicide. In the graph of FIG. 3, the value obtained by dividing 1000 by the heat treatment temperature T (K) is plotted on the horizontal axis, and the partial pressure of the oxidizing species (O$_2$ and H$_2$O) is plotted on the vertical axis.

The solid triangles shown in FIG. 3 denote the conditions for the heat treatment (the partial pressure of oxidizing species and the heat treatment temperature) performed in a He atmosphere of 133 Pa (1 Torr). Where the heat treatment was carried out in a He atmosphere, it was possible to suppress the increase in the thickness of the SiO$_2$ film and the formation of a silicide regardless of the partial pressure of the oxidizing species and the heat treatment temperature.

The solid line joining the solid circles in FIG. 3 denotes the reaction boundary of the oxidation-reduction reaction denoted by reaction formula (1) above, the oxidation-reduction reaction taking place in the SiO$_2$/Si boundary in the case where the heat treatment is carried out in an atmosphere that does not contain He. To be more specific, in the region above the solid line, the reaction to form SiO$_2$ is predominant, and the reaction to form an SiO gas is predominant in the region below the solid line. Incidentally, the solid line can be represented by an equation "$P_0 = 133 \times 10^{11.703 - 18114/T}$ Pa", where $P_0$ represents the partial pressure (Pa) of the oxidizing species, and T represents the heat treatment temperature (K).

Further, the broken line joining the solid squares in FIG. 3 denotes the reaction boundary of the reduction reaction of the SiO$_2$ layer that takes place in the ZrO$_2$/SiO$_2$/Si structure in the case where the heat treatment is carried out in an atmosphere that does not contain He. To be more specific, a silicide is not formed in the region above the broken line, and a silicide is formed in the region above the broken line. Incidentally, the broken line can be represented by an equation "$P_0 133 \times 10^{8.903 - 18114/T}$ Pa", where $P_0$ represents the partial pressure (Pa) of the oxidizing species, and T represents the heat treatment temperature (K).

In order to suppress the increase in the thickness of the SiO$_2$ film and the formation of a silicide in the case where the heat treatment is carried out in an atmosphere that does not contain He, it is necessary to control the partial pressure of the oxidizing species and the heat treatment temperature to be positioned within a region sandwiched between the solid line and the broken line in FIG. 3. However, the particular region is very small. In addition, it is impossible to control the partial pressure and the heat treatment temperature completely uniformly. It follows that, where the heat treatment is carried out in an atmosphere that does not contain He, it is very difficult to suppress the increase in the thickness of the SiO$_2$ film and the formation of a silicide.

On the other hand, where the heat treatment was carried out in a He atmosphere, it was possible to suppress the increase in the thickness of the SiO$_2$ film and the formation of a silicide even if the partial pressure of the oxidizing species and the heat treatment temperature failed to be positioned within the region sandwiched between the solid line and the broken line shown in FIG. 3, not to mention the case where the partial pressure of the oxidizing species and the heat treatment temperature were positioned within the particular region noted above. In other words, the heat treatment in a He atmosphere permits markedly widening the allowable ranges of the heat treatment temperature and the partial pressure of the oxidizing species. It follows that the conditions for the heat treatment can be controlled easily.

Then, studied was the relationship between the effect of suppressing the increase in the thickness of the SiO$_2$ film and the formation of a silicide, which is produced by the use of a He and/or Ne atmosphere, and the heat treatment temperature. It has been found as a result of the measurement by an electron spin resonance (ESR) that dangling bonds are formed at the SiO$_2$/Si interface, i.e., SiO is generated, in the case where the heat treatment temperature is 650° C. or higher. To be more specific, it has been clarified that the use of the He and/or Ne atmosphere is particularly effective in the case where the heat treatment temperature is 650° C. or higher. Incidentally, it is desirable to carry out the heat treatment at a temperature at which the constituting elements are unlikely to be deteriorated, though the upper limit of the heat treatment temperature is not particularly specified. For example, where the metal oxide film is a ZrO$_2$ layer, it is desirable to carry out the heat treatment at a temperature of 1,200° C. or lower at which the ZrO$_2$ layer is unlikely to be deteriorated, more desirably at a temperatures of 1,050° C. or lower.

As described above, prominent effects can be produced by the use of the He and/or Ne atmosphere. The reason for the production of the particular effect is considered to be, for example, as follows.

FIG. 4A schematically shows the heat treatment carried out in UHV or $N_2$ atmosphere, and FIG. 4B schematically shows the heat treatment carried out in a He atmosphere. Incidentally, the interface between the Si substrate and the $ZrO_2$ layer and the region in the vicinity of the interface are depicted in each of FIGS. 4A and 4B. It should be noted that a chemical oxide ($SiO_2$) film is formed on the surface of the Si substrate.

Where the heat treatment is carried out in UHV or $N_2$ atmosphere, an SiO gas is generated by the reaction (1) above in the $Si/SiO_2/ZrO_2$ interface, as shown in FIG. 4A. In accordance with the progress of the SiO gas generation, $SiO_2$ layer in the interface decreases and $ZrO_2$ layer, silicon substrate and SiO gas come into contact to one another so as to promote the generation of a silicide by the reaction (2) above.

It should be noted that the size and mass of each of the He molecule and the Ne molecule are smaller than those of the $N_2$ molecule and, thus, the diffusion rate of each of the He molecule and the Ne molecule into the $ZrO_2$ layer is markedly higher than that of the $N_2$ molecule. In other words, the $N_2$ molecules within the atmosphere are unlikely to be diffused into the $ZrO_2$ layer. On the other hand, the He molecules and the Ne molecules within the atmosphere are easily diffused into the $ZrO_2$ layer. In addition, it is possible for each of the He molecules and the Ne molecules to be present within the $ZrO_2$ layer in a concentration higher than that of the $N_2$ molecules.

Therefore, where the heat treatment is carried out in the He and/or Ne atmosphere, many SiO molecules generated in the $Si/SiO_2/ZrO_2$ interface collide against the He molecules and the Ne molecules in the vicinity of the $Si/SiO_2/ZrO_2$ interface. As a result, the diffusion of the SiO molecules from the $Si/SiO_2/ZrO_2$ interface into the $ZrO_2$ layer is suppressed so as to suppress the reaction of reaction formula (2) to form a silicide.

It should also be noted that the He molecules and the Ne molecules arriving at the $Si/SiO_2/ZrO_2$ interface produce the quench effect of suppressing the thermal vibration at the interface, e.g., vibration of the Si—O bond. It follows that it is also possible to suppress the generation of the SiO molecules by the reaction (1).

What should also be noted is that the He and/or Ne atmosphere in which the heat treatment is carried out is an inert atmosphere that scarcely contains oxidizing species such as $O_2$ and $H_2O$. It follows that the degradation of the constituting element caused by, for example, the oxidation-reduction reaction is not generated by the use of the He and/or Ne atmosphere.

As described above, it is considered possible to suppress the increase in the thickness of the $SiO_2$ film and the formation of a silicide.

A second embodiment of present invention will now be described.

In the first embodiment, the structure shown in FIG. 1B was subjected to a heat treatment in a He and/or Ne atmosphere so as to increase the density of the $ZrO_2$ layer 14 and to decrease the defect therein, as described above. In the second embodiment, however, the He and/or Ne atmosphere is used as an atmosphere for carrying out an activation anneal.

The second embodiment is substantially equal to the first embodiment, except that the first and second embodiments differ from each other in the conditions for the activation anneal. Such being the situation, only the differences from the first embodiment will be described in respect of the second embodiment.

In the method according to the second embodiment, the structure shown in FIG. 1B is formed first by the method equal to that described previously in conjunction with the first embodiment. Incidentally, a heat treatment for increasing the density of the $ZrO_2$ layer 14 and for decreasing the defect is not carried out in the second embodiment. Then, the structures shown in FIGS. 1C and 1D are obtained in the order mentioned by the methods equal to those described previously in conjunction with the first embodiment.

Next, the polysilicon layer 15 is patterned by RIE with the photoresist pattern 16 used as a mask, followed by patterning the $ZrO_2$ layer 14 by RIE. As a result, the gate electrode 15 and the gate insulator 14 are obtained, as shown in FIG. 1E. Then, an ion implantation of arsenic is carried out under an accelerating energy of, for example, 40 keV and at a dose of $2 \times 10^{15}$ $cm^{-2}$, followed by applying an activation anneal. In the second embodiment, the activation anneal is carried out in the He and/or Ne atmosphere. The following description covers the case where the activation anneal is carried out in an Ne atmosphere. The details of the conditions for the activation anneal are as given below. In this fashion, the $n^+$-type gate electrode 15, the $n^+$-type source region 17 and the $n^+$-type drain region 18, each having a high impurity concentration, are formed simultaneously. Further, the structure shown in FIG. 1F is obtained by the method equal to that described previously in conjunction with the first embodiment, thereby finishing the manufacture of an n-type MOS transistor.

| Heat Treatment Conditions (Ne atmosphere): | |
| --- | --- |
| Background vacuum level: | $133 \times 10^{-7}$ Pa |
| Ne gas pressure: | 1 atm |
| Sum of oxygen and water vapor partial pressures in atmosphere: | $133 \times 10^{-6}$ Pa |
| Substrate temperature: | 1,000° C. |
| Heat treatment time: | 10 seconds |

The heat treatment temperature noted above and the partial pressure of the oxidizing species noted above are positioned in the region below the broken line given in the graph of the heat treatment conditions shown in FIG. 3. To be more specific, a silicide is generated, if the heat treatment is carried out within an atmosphere that does not contain He and/or Ne at the heat treatment temperature noted above and the partial pressure of the oxidizing species noted above. In addition, the $ZrO_2$ layer 14 is covered with the thick gate electrode 15 when the heat treatment is applied. It should be noted that the gate electrode 15 plays the role of preventing the oxidizing species within the atmosphere from being diffused into the $ZrO_2$ layer 14. Therefore, where the heat treatment is carried out within an atmosphere that does not contain He and/or Ne at the heat treatment temperature noted above and the partial pressure of the oxidizing species noted above, a silicide tends to be formed easily in the interface between the gate electrode 15 and the $ZrO_2$ layer 14.

On the other hand, where the heat treatment is carried out in an Ne atmosphere as described above, it is possible to suppress formation of a silicide by the reasons equal to those described previously in conjunction with the first embodiment. It follows that it is possible to suppress the increase in the roughness.

As described above, the oxidizing species are unlikely to be diffused into the $ZrO_2$ layer 14 under the state that the $ZrO_2$ layer 14 is covered with the gate electrode 15. Therefore, an $SiO_2$ film is unlikely to be formed even where the partial pressure of the oxidizing species in the heat treatment atmosphere is relatively high. However, it is desirable for the sum of the oxygen partial pressure and the water vapor partial pressure within the He and/or Ne atmosphere to be $133\times10^{11.703-18114/T}$ Pa or lower, more desirably $133\times10^{8.903-18114/T}$ Pa or lower.

In order to suppress the diffusion of the oxidizing species into the $ZrO_2$ layer 14, it is possible to form another cap film in place of the gate electrode 15. For example, it is possible to carry out the heat treatment within a He and/or Ne atmosphere under the state that the polysilicon layer 15 is covered with a cap film, followed by removing the cap film and subsequently forming the gate electrode 15. Incidentally, it is desirable for the cap film to have a thickness falling within a range of between 5 nm and 500 nm.

A third embodiment of present invention will now be described.

The method according to each of the first and second embodiments makes it possible to suppress the increase in the thickness of the $SiO_2$ film and the formation of a silicide in applying an activation anneal or a heat treatment for increasing the density of the $ZrO_2$ layer 14 and for decreasing the defect therein. However, the formation of a silicide are not necessarily generated only during these heat treatments. For example, when the polysilicon layer 15 is formed by the CVD method using a silane gas, the hydrogen generated by the thermal decomposition of the silane gas reduces the surface of the $ZrO_2$ layer 14, with the result that a silicide is generated. The particular silicide formation decreases the thickness of the $ZrO_2$ layer 14 and introduces defects into the $ZrO_2$ layer 14 so as to increase the leak current. Also, since the polysilicon layer 15 is thick, it is difficult to supply a sufficiently large amount of He and/or Ne into the $ZrO_2$ layer 14 when an activation anneal is applied in a He and/or Ne atmosphere. The method according to the third embodiment is effective for dealing with the particular problem.

The third embodiment is substantially equal to the first embodiment, except that the third embodiment differs from the first embodiment in the conditions for forming the polysilicon layer 15 and that He is supplied to the polysilicon layer 15 in the third embodiment before the activation anneal. To be more specific, the structure shown in FIG. 1B is prepared first in the third embodiment by the method equal to that described previously in conjunction with the first embodiment.

Next, the polysilicon layer 15 is formed on the $ZrO_2$ layer 14 by the CVD method using a silane gas. To be more specific, the substrate temperature is elevated to 500° C. in UHV of $8.0\times133\times10^{-10}$ Pa with the background vacuum level set at $133\times5.4\times10^{-10}$ Pa, followed by supplying a silane gas at a flow rate of 20 sccm. Incidentally, in the initial period of supplying a silane gas, the substrate temperature is set at 500° C. and, then, the substrate temperature is elevated to 600° C. Also, the total pressure in this case is $1\times133$ Pa. The silane gas supply is stopped 10 minutes after the start-up of the silane gas supply, and the substrate temperature is lowered. If the polysilicon layer 15 is formed by the particular method, it is possible to suppress the generation of a silicide during formation of the polysilicon layer 15.

Figure 5:
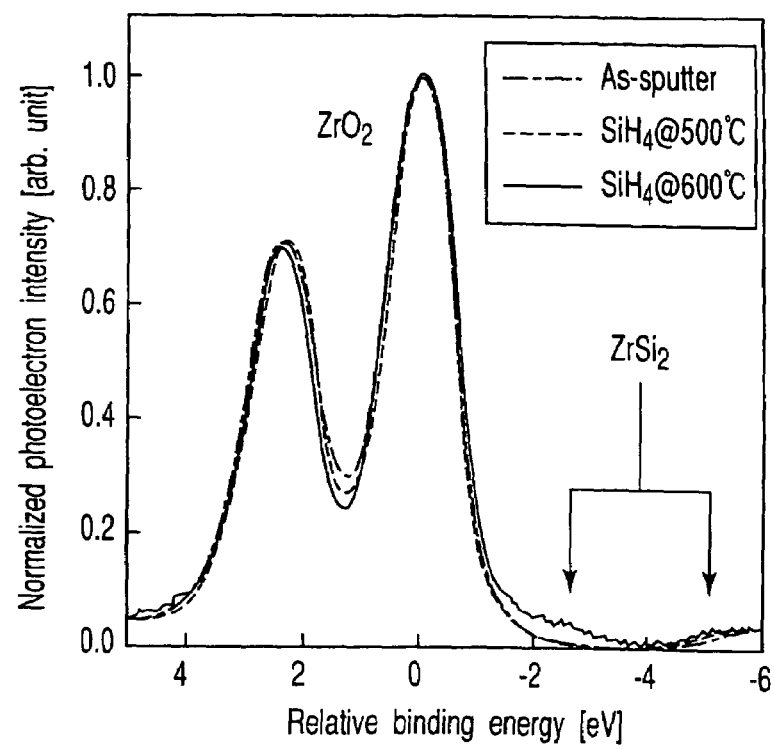
FIG. 5 is a graph showing the result of measurement by an in-situ XPS carried out on a stacked structure of a $ZrO_2$ layer and a polysilicon layer.

FIG. 5 is a graph showing the result of measurement by an in-situ XPS carried out on a stacked structure of a $ZrO_2$ layer 14 and a polysilicon layer 15. Incidentally, Mg Kα was used as the X-ray source, and the take-off angle of photoelectron was set at 45°. Also, the graph of FIG. 5 shows the Zr3d spectrum. In the graph of FIG. 5, the binding energy is plotted on the horizontal axis, and the normalized photoelectron intensity is plotted on the vertical axis.

The curve of "As sputter" shown in FIG. 5 denotes the data obtained in respect of the surface of the $ZrO_2$ layer 14 before formation of the polysilicon layer 15. Also, the curves of "$SiH_4$ @500° C." and "$SiH_4$ @600° C." denote the data obtained in the cases where the substrate temperature was set at 500° C. and 600° C., respectively, in forming the polysilicon layer 15.

As shown in FIG. 5, $ZrSi_2$ is generated in the case where the substrate temperature is set at 600° C. in forming the polysilicon layer 15. It should be noted in this connection that, where the substrate temperature is equal to or higher than 600° C., hydrogen, which is one of the decomposed products of the silane gas, reduces $ZrO_2$ and, at the same time, a reaction to form a silicide is carried out between $SiH_2$, which is the other decomposition product of the silane gas, and the reduced product of $ZrO_2$. On the other hand, where the substrate temperature is set at 500° C. in forming the polysilicon layer 15, $ZrSi_2$ is not formed. It follows that it is possible to suppress the formation of a silicide if polysilicon is deposited with the substrate temperature set lower than 600° C.

Incidentally, a silicide is formed in forming the polysilicon layer 15 in only the poly-Si/$ZrO_2$ interface. Also, in view of the depositing rate, it is advantageous to form the polysilicon layer 14 with the substrate set at a high temperature. Therefore, it is desirable to cover the $ZrO_2$ layer 14 with polysilicon in the initial stage of forming the polysilicon layer 15 with the substrate temperature set lower than 600° C., followed by further depositing polysilicon by elevating the substrate temperature to 600° C. or higher.

After the structure shown in FIG. 1C is obtained as above, the structure shown in FIG. 1D is obtained by the method equal to that described previously in conjunction with the first embodiment. Then, the polysilicon layer 15 and the $ZrO_2$ layer 14 are patterned by the method equal to that described previously in conjunction with the first embodiment.

Next, He and/or Ne is introduced into the polysilicon layer 15 by means of an ion implantation. The following description covers the case where He is introduced into the polysilicon layer 15 by means of an ion implantation under an accelerating energy of 40 keV and with a dose of $2\times10^{15}$ cm$^{-2}$. Incidentally, if the acceleration energy is increased, it is possible to introduce He and/or Ne into not only the polysilicon layer but also the $ZrO_2$ layer 14 by the ion implantation.

After the ion implantation for introducing He and/or Ne into the polysilicon layer 15, an ion implantation of arsenic and the activation anneal are carried out by the method similar to that described previously in conjunction with the first embodiment. Since He is contained in the polysilicon layer 15 as described above, it is possible to supply a sufficiently large amount of He molecules from the polysilicon layer 15 into the $ZrO_2$ layer 14. It follows that it is possible to suppress the silicide formation by the reaction (2), etc. at the poly-Si/$ZrO_2$ interface.

After the structure shown in FIG. 1E is obtained as described above, the structure shown in FIG. 1F is obtained by the method equal to that described previously in conjunction with the first embodiment, thereby finishing the manufacture of an n-type MOS transistor.

In the method described above, an ion implantation is utilized for supplying He and/or Ne into the polysilicon layer 15. However, it is also possible to utilize another method. For example, it is possible to generate a He and/or Ne gas plasma by a capacitive coupling discharge or an ECR (electron cyclotron resonance) discharge and to supply He into the polysilicon layer 15 by utilizing the gas plasma thus generated. In the case of using the He gas plasma, the electron temperature is 5 eV in a region having a high electron density, and the sheath voltage for determining the energy of the ion is about 15 eV. Therefore, if the substrate is disposed within such a region, it is possible to irradiate the polysilicon layer 15 with ions having a high energy of about 15 eV.

A fourth embodiment of the present invention will now be described.

In the third embodiment, the polysilicon layer 15 containing He and/or Ne is obtained by supplying He and/or Ne into the polysilicon layer 15. In the fourth embodiment, however, the polysilicon layer 15 containing He and/or Ne is obtained by forming the polysilicon layer 15 within an atmosphere containing He and/or Ne.

In the fourth embodiment, the structure shown in FIG. 1B is obtained first by the method equal to that described previously in conjunction with the first embodiment.

Next, the polysilicon layer 15 containing He and/or Ne is formed on the $ZrO_2$ layer 14 by the CVD method using a silane gas. For example, the substrate temperature is elevated to 500° C. while allowing a He gas to flow at a flow rate of 1 slm with the background vacuum level set at $133 \times 5.4 \times 10^{-10}$ Pa. The pressure of the He atmosphere is $10 \times 133$ Pa. Then, a silane gas is supplied at a flow rate of 20 sccm, and a He gas is supplied at a flow rate of 120 sccm. Incidentally, the total pressure in this case is $3 \times 133$ Pa. The supply of the $SiH_4$ gas is stopped 10 minutes after start-up of the supply of the $SiH_4$/He mixture gas, followed by lowering the substrate temperature and subsequently stopping the He gas supply so as to obtain the polysilicon layer 15 containing He.

Then, the structure shown in FIG. 1D is obtained by the same method as that described previously in conjunction with the first embodiment, followed by patterning the polysilicon layer 15 and the $ZrO_2$ layer 14 by the same method as that described previously in conjunction with the first embodiment.

Further, the arsenic ion implantation and the activation anneal in an atmosphere containing He and/or Ne are carried out by the methods equal to those described previously in conjunction with the first embodiment. The activation anneal is carried out under, for example, the conditions given below:

| Heat Treatment Conditions (He atmosphere): | |
| --- | --- |
| Background vacuum level: | $5.4 \times 133 \times 10^{-10}$ Pa |
| He gas pressure: | $1 \times 133$ Pa |
| Substrate temperature: | 920° C. |
| Heat treatment time: | 10 minutes |

After the structure shown in FIG. 1E is obtained in this fashion, the structure shown in FIG. 1F is obtained by the same method as that described previously in conjunction with the first embodiment.

Figure 6:
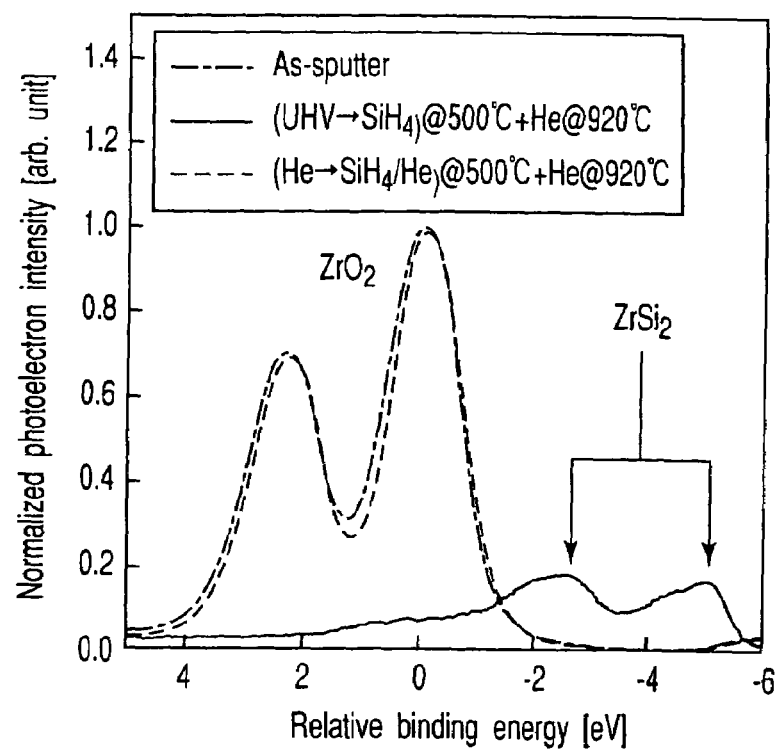
FIG. 6 is a graph showing the result of measurement by an in-situ XPS carried out on a stacked structure of a $ZrO_2$ layer and an polysilicon layer included in the MOS transistor.

FIG. 6 is a graph showing the result of measurement by an in-situ XPS carried out on a stacked structure of a $ZrO_2$ layer 14 and a polysilicon layer included in the MOS transistor obtained by the method described above. In performing the measurement, Mg Kα was used as the X-ray source, and the take-off angle of photoelectron was set at 45°. Also, the graph of FIG. 6 shows the Zr3d spectra. In the graph of FIG. 6, the binding energy is plotted on the horizontal axis, and the normalized photoelectron intensity is plotted on the vertical axis.

The curve of "(UHV→$SiH_4$/He) @500° C.+He @920° C." shown in FIG. 6 denotes the data obtained in the case where the formation of the polysilicon layer 15 and the activation anneal were carried out under the conditions given above. On the other hand, the curve of "(UHC→$SiH_4$) @500° C.+He @920° C." shown in FIG. 6 denotes the data obtained in the case where the formation of the polysilicon layer 15 and the activation anneal were carried out under the same conditions above except that a He gas was not added on forming the polysilicon layer 15. Further, the curve "As-sputter" shown in FIG. 6 denotes the data obtained in respect of the surface of the $ZrO_2$ layer 14 before formation of the polysilicon layer 15.

As shown in FIG. 6, a silicide was formed in the case where formation of the polysilicon layer 15 was not carried out in the presence of a He gas. It should be noted in this connection that the polysilicon layer 15 was thick, and the pressure of the He atmosphere was low in performing the activation anneal, with the result that a sufficiently large amount of the He molecules was not supplied into the $ZrO_2$ layer 14. On the other hand, it is possible to supply a sufficiently large amount of the He molecules into the $ZrO_2$ layer 14, if He is contained in the polysilicon layer 15 during the activation anneal, so as to make it possible to suppress the formation of a silicide.

The effect described above can be generated in the case where the polysilicon layer 15 contains He in the applying the activation anneal. The reason for the generation of the particular effect is considered to be as follows.

Figure 7A:
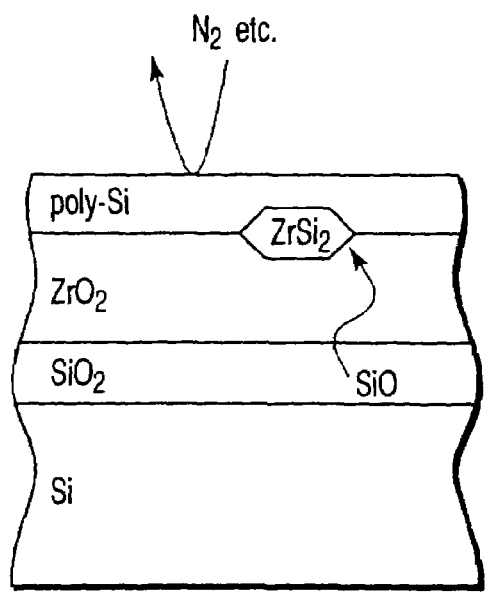
FIG. 7A is a cross sectional view schematically showing the activation annealing performed in UHV or $N_2$ atmosphere under the state that the polysilicon layer does not contain He.
Figure 7B:
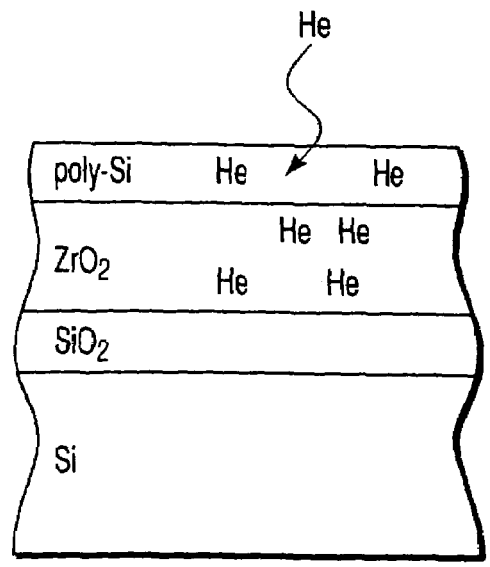
FIG. 7B is a cross sectional view schematically showing the activation annealing performed in a He atmosphere under the state that the polysilicon layer contains He.

FIG. 7A schematically shows the activation anneal carried out within UHV or $N_2$ atmosphere under the state that the polysilicon layer 15 does not contain He. On the other hand, FIG. 7B schematically shows the activation anneal carried out within a He atmosphere under the state that the polysilicon layer 15 contains He. Incidentally, the interface between the Si substrate and the $ZrO_2$ layer, the interface between the $ZrO_2$ layer and the polysilicon layer, and the regions in the vicinity thereof are depicted in FIGS. 7A and 7B. It should also be noted that a chemical oxide ($SiO_2$) film is formed on the surface of the Si substrate.

Where the activation anneal is carried out within UHV or $N_2$ atmosphere, an SiO gas is generated by the reaction (1) at the Si/$SiO_2$/$ZrO_2$ interface, as shown in FIG. 7A. The SiO gas is diffused into the $ZrO_2$ layer so as to form a silicide by the reaction (2) in, for example, the poly-Si/$ZrO_2$ interface.

On the other hand, if the activation anneal is carried out within a He atmosphere and if the polysilicon layer 15 contains He before the activation anneal, a sufficiently large amount of He molecules is supplied into the $ZrO_2$ layer, as shown in FIG. 7B. As a result, many SiO molecules generated at the Si/$SiO_2$/$ZrO_2$ interface collide against the He molecules in the vicinity of the interface. It follows that it is possible to suppress formation of a silicide in, for example, the Si/$SiO_2$/$ZrO_2$ interface and the poly-Si/$ZrO_2$ interface as described previously with reference to FIG. 4B.

A fifth embodiment of the present invention will now be described.

In each of the third and fourth embodiments described above, He and/or Ne is supplied to the polysilicon film 15 before the activation anneal, or the polysilicon film 15 containing He and/or Ne is formed before the activation anneal. In the fifth embodiment, however, He and/or Ne is supplied to the surface region of the substrate 11.

In the fifth embodiment, the structure shown in FIG. 1B is obtained first by the method equal to that described previously in conjunction with the first embodiment.

Next, the structure shown in FIG. 1B is subjected to a hydrochloric acid/ozone treatment as a pretreatment so as to remove effectively the contaminant from the surface of the silicon wafer 11. As a result, a chemical oxide film having a thickness of about 1 nm is formed on the surface of the silicon wafer 11. Incidentally, it is possible to apply a dilute hydrofluoric acid treatment after formation of the chemical oxide film so as to decrease the EOT.

Next, the wafer 11 after the pretreatment is transferred into a sputtering chamber. In the sputtering chamber, He and/or Ne is supplied into the surface region of the silicon wafer 11 by using He and/or Ne gas plasma. For example, the surface of the silicon wafer 11 is irradiated with an Ne gas RF plasma while maintaining the temperature of the wafer 11 at room temperature, with the result that Ne is supplied into the surface region of the silicon wafer 11. Then, the $ZrO_2$ layer 14 having a thickness of about 2 nm is formed on the chemical oxide film by the sputtering method using a $ZrO_2$ target and an $Ne/O_2$ gas RF plasma (400 W). In the structure shown in FIG. 1B thus obtained, Ne is contained in a high concentration in the $ZrO_2$ layer, the $Si/SiO_2/ZrO_2$ interface, and the regions in the vicinity thereof.

Further, the structures shown in FIGS. 1C to 1F are successively obtained by the methods equal to those described previously in conjunction with the first embodiment, thereby finishing the manufacture of an n-type MOS transistor.

As described above, the method of the fifth embodiment also makes it possible to suppress the formation of a silicide at, for example, the $Si/SiO_2/ZrO_2$ interface and the poly-Si/$ZrO_2$ interface like the method according to each of the third and fourth embodiments.

A sixth embodiment of the present invention will now be described.

In the sixth embodiment, He and/or Ne is supplied to the $ZrO_2$ layer before the activation anneal. The method of the sixth embodiment also makes it possible to suppress the formation of a silicide at, for example, the $Si/SiO_2/ZrO_2$ interface and the poly-Si/$ZrO_2$ interface like the method according to each of the third to fifth embodiments.

In order to supply He and/or Ne into the $ZrO_2$ layer before the activation anneal, it is possible to utilize, for example, a He plasma or an Ne plasma. In this case, however, it is desirable to use a plasma having a sufficiently low electron temperature in order to prevent, for example, the substrate from being damaged. For example, where an Ne plasma is generated by a capacitive coupling discharge, an inductive coupling discharge or an ECR discharge, the electron temperature in an Ne plasma region having a high electron density is 5 eV and the sheath voltage, which determines the energy of the ions irradiating the substrate, is about 15 eV. If the substrate is irradiated with ions having a high energy of about 15 eV, the substrate is damaged. On the other hand, in a region having an electron temperature of 1 eV or lower, which is sufficiently apart from the Ne plasma region having a high electron density, the sheath voltage is about 3 eV. Therefore, if the substrate is arranged in the region having a low electron temperature, it is possible to supply Ne to the $ZrO_2$ layer without damaging the substrate.

In order to supply He and/or Ne to the $ZrO_2$ layer 14 before the activation anneal, it is possible to utilize the ion implantation of He or Ne, or an annealing treatment in an atmosphere containing He and/or Ne. It should be noted, however, that, in the case of utilizing the ion implantation, it is desirable to set the accelerating energy at a low level in order to suppress the damage done to the substrate. Also, in the case of utilizing the ion implantation, it is desirable to repair the defect generated by the ion implantation by a post-annealing treatment.

A seventh embodiment of the present invention will now be described.

In the seventh embodiment, the sidewall insulating film 19 containing He and/or Ne is formed first, followed by carrying out an activation anneal. To be more specific, in the seventh embodiment, the structure shown in FIG. 1B is obtained first by the method equal to that described previously in conjunction with the first embodiment. Incidentally, in the seventh embodiment, the heat treatment for increasing the density of the $ZrO_2$ layer 14 and for decreasing the defect is not carried out. Then, the structures shown in FIGS. 1C and 1D are obtained successively by the methods equal to those described previously in conjunction with the first embodiment.

Next, the polysilicon layer 15 is patterned by the etching using the photoresist pattern 16 as a mask and a plasma of $HCl/Cl_2/O_2$, followed by patterning the $ZrO_2$ layer 14 by RIE, thereby obtaining the gate electrode 15 and the gate insulator 14 as shown in FIG. 1E. Further, an arsenic ion implantation is carried out under, for example, an accelerating energy of 40 keV and with a dose of $2 \times 10^{15}$ $cm^{-2}$. Incidentally, in the seventh embodiment, the activation anneal is not carried out in this stage and is carried out later.

Next, the silicon oxide film 19 is deposited on the entire surface in a thickness of 300 nm by the CVD method of a $TEOS/O_3$ system. In the seventh embodiment, He and/or Ne is added to the raw material gas used for forming the silicon oxide film 19. The following description covers the case where He is added to the raw material gas so as to obtain the silicon oxide film 19 containing He.

Further, the structure shown in FIG. 1F is obtained by the method equal to that described previously in conjunction with the first embodiment. In the seventh embodiment, the activation anneal is carried out any time after formation of the silicon oxide film 19, thereby finishing the manufacture of an n-type MOS transistor.

As described above, in the seventh embodiment, the sidewall insulating film 19 or the insulating film 19 before patterned contains He and/or Ne. Therefore, during the activation anneal, He and/or Ne is supplied from the sidewall insulating film or the insulating film 19 before patterned into the $ZrO_2$ layer 14. It follows that the method according to the seventh embodiment also permits suppressing the formation of a silicide. Incidentally, the SiO gas tends to be generated during the heat treatment from the contact portion between the poly-Si/$ZrO_2$ interface and the $SiO_2$ layer.

A eighth embodiment of the present invention will now be described.

In the eighth embodiment, a gate electrode having a roundish edge is obtained by oxidizing the surface of the patterned polysilicon film 15. Also, in the eighth embodiment, the oxidation is carried out in an atmosphere containing He and/or Ne. To be more specific, in the seventh embodiment, the structure shown in FIG. 1B is obtained by the method equal to that described previously in conjunction with the first embodiment. Incidentally, the heat treatment for increasing the density of the $ZrO_2$ layer 14 and for decreasing the defect is not carried out in the eighth embodiment. Further, the structures shown in FIGS. 1C and 1D are obtained successively by the methods equal to those described previously in conjunction with the first embodiment.

Figure 8:
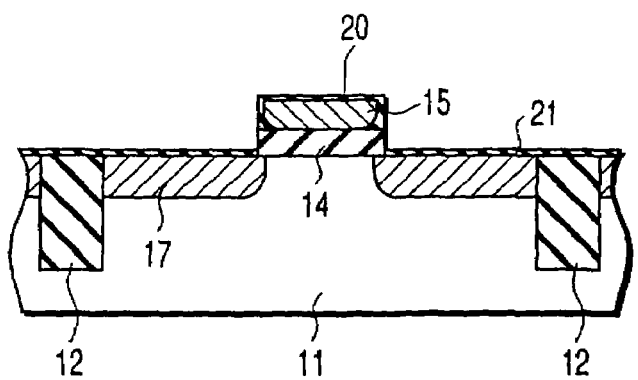
FIG. 8 is a cross sectional view schematically showing the structure obtained by applying an oxidizing treatment to the structure shown in FIG. 1E.

Next, the polysilicon layer 15 is patterned by the etching using the photoresist pattern 16 as a mask and a HBr series plasma, followed by patterning the $ZrO_2$ layer 14 by RIE, thereby obtaining the gate electrode 15 and the gate insulator 14 as shown in FIG. 1E. Then, the surface of the gate electrode 15 is oxidized in an atmosphere containing oxidizing species and He and/or Ne. Further, a heat treatment is carried out at 800° C. for 30 seconds in an atmosphere of atmospheric pressure containing, for example, 10% of oxygen and 90% of He. As a result, an oxide film 20 is formed on the surface of the gate electrode 15, and the edge of the gate electrode 15 is rendered roundish, as shown in FIG. 8. Incidentally, during the heat treatment, an oxide film is also formed on the surface of the substrate 11. A reference numeral 21 shown in FIG. 8 denotes the oxide film formed on the surface of the substrate 11.

Next, an arsenic ion implantation and an activation anneal are carried out by the methods equal to those described previously in conjunction with the first embodiment, thereby obtaining the structure shown in FIG. 1E. Further, the structure shown in FIG. 1F is obtained by the method equal to that described previously in conjunction with the first embodiment, thereby finishing the manufacture of an n-type MOS transistor.

In the eighth embodiment, the surface of the gate insulator 14 is oxidized in an atmosphere containing He and/or Ne and, thus, the oxide film 20 before the activation anneal contains He and/or Ne. It follows that it is possible to suppress the formation of a silicide, which is derived from the SiO generation from, for example, the contact position between the poly-Si/$ZrO_2$ interface and the $SiO_2$ layer during the activation anneal.

In the eighth embodiment described above, the oxide film 20 containing He and/or Ne is formed by oxidizing the surface of the gate insulator 14 in an atmosphere containing He and/or Ne. Alternatively, the oxide film 20 containing He and/or Ne can also be formed by another method. For example, it is possible to form the oxide film 20 by oxidizing the surface of the gate insulator 14 in an atmosphere that does not contain He and/or Ne, followed by exposing the oxide film 20 to a He and/or Ne plasma. In this case, it is desirable to use a plasma having a sufficiently low electron temperature in order to prevent the substrate from being damaged. For example, in the case where an Ne plasma is generated by a capacitive coupling discharge, an inductive coupling discharge or an ECR discharge, a region of the Ne plasma having a high electron density has an electron temperature of 5 eV and a sheath voltage of about 15 eV. If the substrate is irradiated with ions having a high energy of about 15 eV, the substrate is damaged. On the other hand, in a region having an electron temperature of 1 eV or lower, which is sufficiently apart from the region of the Ne plasma having a high electron density, the sheath voltage is about 3 eV. Therefore, if the substrate is arranged in the region having a low electron temperature noted above, it is possible to supply Ne into the oxide film 20 without damaging, for example, the substrate.

In order to supply He and/or Ne into the oxide film 20 before the activation anneal, it is possible to utilize a He or Ne ion implantation or an annealing treatment in an atmosphere containing He and/or Ne. It should be noted, however, that, in the case of utilizing the ion implantation, it is desirable to set the accelerating energy at a low level in order to suppress the damage done to the substrate. Also, in the case of utilizing the ion implantation, it is desirable to repair the defect generated by the ion implantation by a post-annealing treatment.

In each of the first to eighth embodiments described above, it is possible to use any of a He atmosphere, an Ne atmosphere and a mixed atmosphere of He and Ne as the atmosphere containing He and/or Ne. It should be noted, however, that the particular effect described above is rendered prominent in the case where the He partial pressure is rendered higher than the Ne partial pressure in the atmosphere.

In each of the first to eighth embodiments of the present invention, it is possible to dilute the atmosphere containing He and/or Ne with a nobel gas such as Ar, Xe or Kr. It is also possible for the atmosphere containing He and/or Ne to be diluted with an inert gas other than the rate gas. For example, it is possible to use a nitrogen gas, $N_2$, for diluting the atmosphere containing He and/or Ne. Further, it is possible to dilute the atmosphere containing He and/or Ne with an active gas in the case of carrying out a heat treatment accompanied by a chemical reaction.

Also, in the case where the atmosphere containing He and/or Ne is diluted with another gas such as an inert gas, it is possible to increase the total pressure without increasing the partial pressure of He or Ne within the atmosphere. Since He or Ne selectively permeates the $ZrO_2$ layer as described above, it is possible to promote the permeation of He or Ne into the $ZrO_2$ layer in this case without increasing the amount of He or Ne used. Also, it is possible to use a high purity inert gas such as a high purity $N_2$ gas, which is available easily, for diluting the atmosphere containing He and/or Ne. Therefore, if the atmosphere is diluted with such a high purity inert gas, it is possible to suppress the impurity concentration in the atmosphere at a low level even in the case where the purity of the He gas or the Ne gas is low.

It is possible for the sum of the He partial pressure and the Ne partial pressure in the atmosphere during the heat treatment to be any of a decompression, an atmospheric pressure, and a compression. It is desirable for the sum of the He partial pressure and the Ne partial pressure to fall within a range of between 1.33 Pa and 101,0800 Pa, more desirably between 133 Pa and 13,300 Pa in view of the purity.

In each of the first to eighth embodiments described above, $ZrO_2$ is used as the material of the metal oxide layer. However, it is also possible to use other materials such as $HfO_2$ and the silicate thereof in place of $ZrO_2$, with substantially the same effect. Also, in each of the first to eighth embodiments described above, the metal oxide layer 14 was formed by the sputtering method. However, it is also possible to form the metal oxide layer by other methods. For example, it is possible to obtain the effect described above even in the case of forming the metal oxide layer 14 by using the thermal CVD method, the ALCVD (Atomic Layer CVD) method, the vapor deposition method, the plasma CVD method or MOCVD (Metal-Organic CVD) method.

In each of the first to eighth embodiments described above, poly-Si is used as the material of the gate electrode 15. However, it is also possible to use another material for forming the gate electrode 15. For example, it is also possible to suppress the formation of a silicide even in the case of using another material containing Si atoms such as poly-SiGe.

In each of the first to eighth embodiments described above, the metal oxide film 14 is patterned before the ion implantation. However, it is also possible to pattern the metal oxide layer 14 after the ion implantation. Also, in each of the first to eighth embodiments described above, an activation anneal is applied to mainly the structure shown in FIG. 1E. However, it is also possible to apply the activation anneal to another structure. For example, an activation anneal can be applied to the structure shown in FIG. 1F.

The technologies according to the first to eighth embodiments can be combined appropriately. Particularly, it is desirable to carry out all the heat treatments at high temperatures, which are carried out after formation of the metal oxide layer 14, e.g., the heat treatments each carried out at a temperature of 650° C. or higher, within an atmosphere containing He and/or Ne.

As described above, the technology according to the first to eighth embodiments makes it possible to lower the roughness in, for example, the interface between the metal oxide layer 14 and the substrate 11 so as to suppress the leak current at the interface. It follows that the technology according to the first to eighth embodiments is useful in, particularly, the case where the semiconductor device of the MIS structure described above is applied to a memory, e.g., a nonvolatile memory which is provided with a memory function by forming a floating gate in the metal oxide layer.

In the MOS transistor obtained by the method according to each of the first to eighth embodiments, it is possible for He and/or Ne to remain in, for example, the metal oxide layer 14 so as to provide an evidence supporting that the particular method has been utilized.

Figure 9:
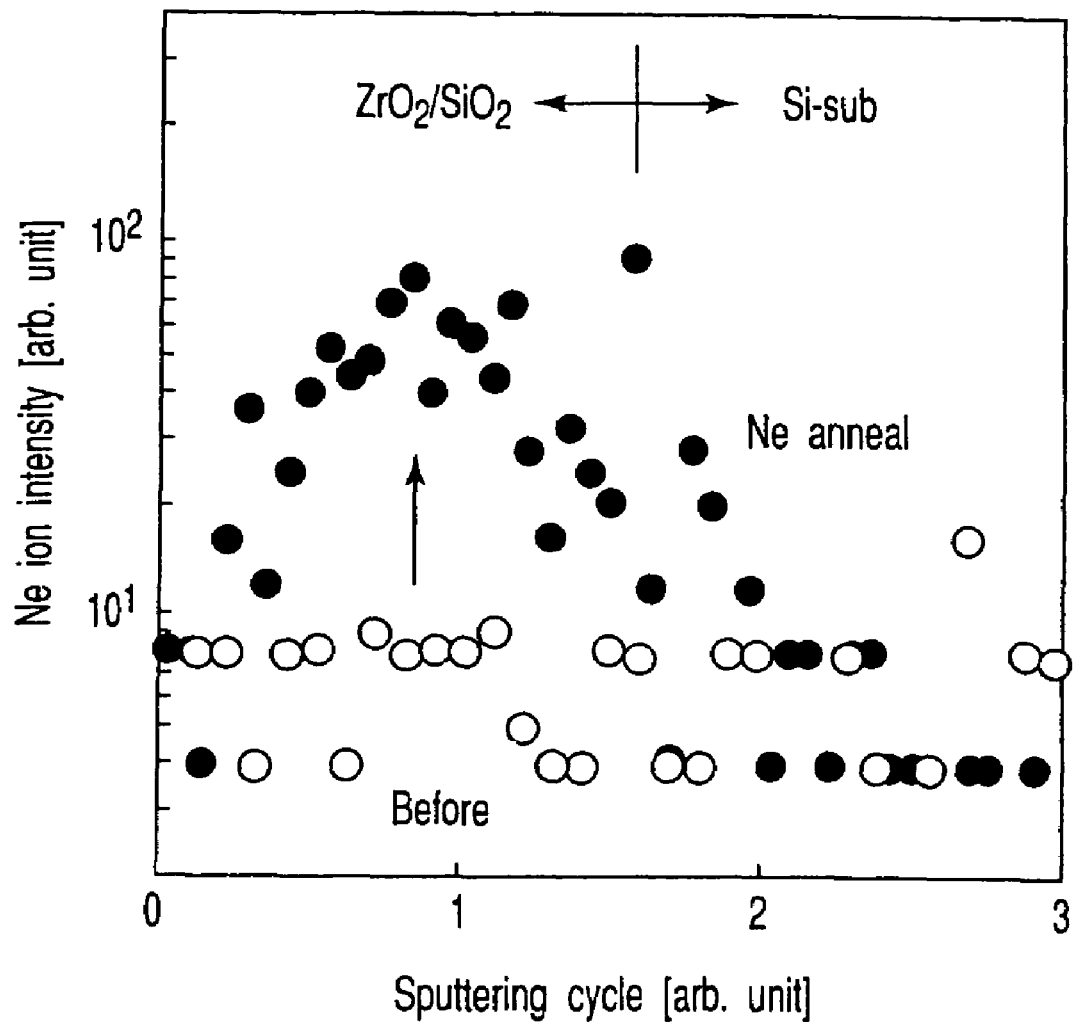
FIG. 9 is a graph showing the distribution of the Ne atom concentration in a $ZrO_2/SiO_2$ stacked structure.

FIG. 9 is a graph showing the distribution of the Ne atom concentration in the $ZrO_2/SiO_2$ stacked structure. The data shown in the graph were obtained by applying a secondary ion mass spectrometry (SIMS) to the MOS transistor prepared by the method according to the second embodiment. In the graph of FIG. 9, the sputtering cycle is plotted on the horizontal axis, and the Ne ion intensity is plotted on the vertical axis. The empty circles in the graph denote the data obtained by the measurement before the activation anneal. On the other hand, the solid circles in the graph denote the data obtained by the measurement after the activation anneal.

As shown in FIG. 9, before the activation anneal in the Ne atmosphere, the Ne atom concentration in the $ZrO_2/SiO_2$ stacked structure is substantially equal to the Ne atom concentration in the Si substrate. In other words, the Ne atom concentration in each of the $ZrO_2/SiO_2$ stacked structure and the Si substrate is substantially zero.

On the other hand, after the activation anneal under the Ne atmosphere, the Ne atom concentration in the $ZrO_2/SiO_2$ stacked structure is markedly increased, though the Ne atom concentration in the Si substrate remains substantially unchanged. Also, the Ne atoms are distributed substantially uniformly in the $ZrO_2/SiO_2$ stacked structure. It is possible to judge whether or not the particular method was utilized for manufacturing the MOS transistor by examining, for example, the Ne atom distribution.

Incidentally, in the case of employing the He atmosphere during the heat treatment, it is possible to observe the He atom distribution similar to the Ne atom distribution. Also, where a mixed atmosphere of He and Ne is used during the heat treatment, it is possible to observe the He atom distribution similar to the Ne atom distribution and the Ne atom distribution. It is also possible to observe the He atom distribution similar to the Ne atom distribution and/or the Ne atom distribution in also the case where any of the constituting element before the heat treatment contains He and/or Ne.

It is advantageous in various points for the manufactured MOS transistor to comprise the metal oxide layer 14 and He and/or Ne contained in the vicinity of the metal oxide layer 14.

For example, where the $ZrO_2$ layer 14 contains He and/or Ne, it is possible to moderate the stress at the interface between the Si substrate 11 and the metal oxide layer 14 and the stress at the interface between the gate electrode 15 and the metal oxide layer 14. In addition, He and/or Ne serves to suppress the thermal vibration of the bond. As a result, the charge in the film and the interfacial level density are lowered in the metal oxide film 14 containing He and/or Ne. It follows that the metal oxide layer 14 has a high dielectric constant, and a leak current is unlikely to take place in the metal oxide layer 14. As a matter of fact, the leak current was measured in respect of the MIS capacitor subjected to an activation anneal in a He atmosphere. It has been found that the leak current was lowered to less than one-tenth of the leak current in the case where the activation anneal was carried out in an $N_2$ atmosphere. Further, where the metal oxide film 14 contains He and/or Ne and a silicate such as $ZrSiO_x$ or $HfSiO_x$ is used as the material thereof, migration of interstitial atoms during the heat treatments is prevented so as to suppress the generation of phase separation, micro-crystal, etc. This improves in-plane uniformity of, for example, dispersion of leak current.

It should also be noted that, where the gate electrode 15 contains He and/or Ne, He and/or Ne is segregated in the grain boundaries of the poly-Si so as to suppress the diffusion of the impurities such as hydrogen and boron. The same effect can be obtained in the case where the substrate 11 contains He and/or Ne. In addition, the mobility is improved because the thermal conductivity is increased. Further, where the insulating film 19 contains He and/or Ne, it is possible to prevent impurities such as boron and hydrogen in the polysilicon layer from diffusing into the insulating film 19. In this case, it is also possible to suppress the diffusion of impurities such as hydrogen and carbon from the insulating film 19 into other constituting elements.

It is desirable for the concentration of He and/or Ne in the metal oxide layer 14 to fall within a range of between $1\times10^{17}$ atoms/cm$^3$ and $1\times10^{21}$ atoms/cm$^3$. Where the concentration of He and/or Ne falls within the range noted above, the construction of the metal oxide layer 14 is not changed by the presence of He and/or Ne.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an Si underlayer;
   a metal oxide layer as a gate insulator supported by the Si underlayer, the gate insulator being higher in dielectric constant than silicon oxide;
   a gate electrode, the gate electrode and the Si underlying layer sandwiching the gate insulator; and
   an Si containing layer containing Si and in contact with the metal oxide layer, the Si containing layer being a sidewall insulating film formed on a side surface of a stacked structure of the gate insulator and the gate electrode, wherein the sidewall insulating film contains He and/or Ne.

2. A semiconductor device comprising:
   an Si containing layer, the Si containing layer including an Si underlying layer comprising source and drain regions spaced apart from each other;
   a metal oxide layer as a gate insulator in contact with a region of the Si underlying layer between the source and drain regions, the gate insulator being higher in dielectric constant than silicon oxide, and at least one region of the Si underlying layer between the source and drain regions and a part of the gate insulator in contact with the region of the Si underlying layer between the source and drain regions containing He and/or Ne;
   a gate electrode facing the region of the Si underlying layer between the source and drain regions with the gate insulator interposed therebetween; and
   a sidewall insulating film formed on a side surface of a stacked structure of the gate insulator and the gate electrode, wherein the gate electrode contains He and/or Ne and the sidewall insulating film contains He and/or Ne.

* * * * *